(12) United States Patent
Schöön

(10) Patent No.: US 8,233,281 B2
(45) Date of Patent: Jul. 31, 2012

(54) DEVICE FOR REDUCING THERMAL STRESS ON CONNECTION POINTS

(75) Inventor: Martin Schöön, Solna (SE)

(73) Assignee: Telefonaktiebolaget L M Ericsson (publ), Stockholm (SE)

( * ) Notice: Subject to any disclaimer, the term of this patent is extended or adjusted under 35 U.S.C. 154(b) by 130 days.

(21) Appl. No.: 12/747,781

(22) PCT Filed: Dec. 17, 2007

(86) PCT No.: PCT/SE2007/051016
§ 371 (c)(1),
(2), (4) Date: Jun. 11, 2010

(87) PCT Pub. No.: WO2009/078767
PCT Pub. Date: Jun. 25, 2009

(65) Prior Publication Data
US 2010/0271780 A1    Oct. 28, 2010

(51) Int. Cl.
*H05K 7/20*    (2006.01)
(52) U.S. Cl. ........ 361/710; 361/707; 361/715; 361/722; 174/15.1; 174/252; 174/520; 174/548; 174/565; 257/706; 257/712; 257/720
(58) Field of Classification Search ............ 361/688, 361/701–712, 715–722
See application file for complete search history.

(56) References Cited

U.S. PATENT DOCUMENTS

| | | | | |
|---|---|---|---|---|
| 5,426,405 A * | 6/1995 | Miller et al. | ................ | 333/247 |
| 5,898,128 A * | 4/1999 | Romero et al. | ................ | 174/565 |
| 6,128,190 A * | 10/2000 | Hardin et al. | ................ | 361/704 |
| 6,163,456 A * | 12/2000 | Suzuki et al. | ................ | 361/704 |
| 7,440,282 B2 * | 10/2008 | Brandenburg et al. | ........ | 361/704 |
| 7,864,532 B1 * | 1/2011 | Ehret et al. | ................ | 361/713 |
| 2005/0224956 A1 | 10/2005 | Kao et al. | | |

FOREIGN PATENT DOCUMENTS

| | | |
|---|---|---|
| EP | 1 729 342 A1 | 12/2006 |
| EP | 1729342 A1 * | 12/2006 |
| JP | 7-221218 A | 8/1995 |

OTHER PUBLICATIONS

International Search Report, PCT/SE2007/051016, Sep. 2, 2008.

* cited by examiner

*Primary Examiner* — Courtney Smith
(74) *Attorney, Agent, or Firm* — Myers Bigel Sibley & Sajovec, P.A.

(57) ABSTRACT

The present invention relates to a device adapted in order to decrease stress on connection points between a heat generating source and a substrate. The device 13 comprises a larger heat-dissipating part 7, and at least one smaller heat-dissipating part 6. The larger part 7 is arranged with at least one cavity 8 for housing the at least one smaller part 6. The at least one smaller part 6 is adapted to be attached to at least one heat-generating source 2, and at the same time more mobile in the cavity 8 and/or less affected by changes in temperature than the larger part.

17 Claims, 4 Drawing Sheets

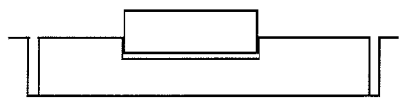
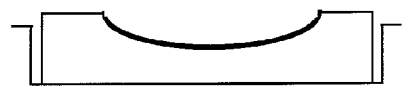
FIG. 4a    FIG. 4b
FIG. 4c    FIG. 4d
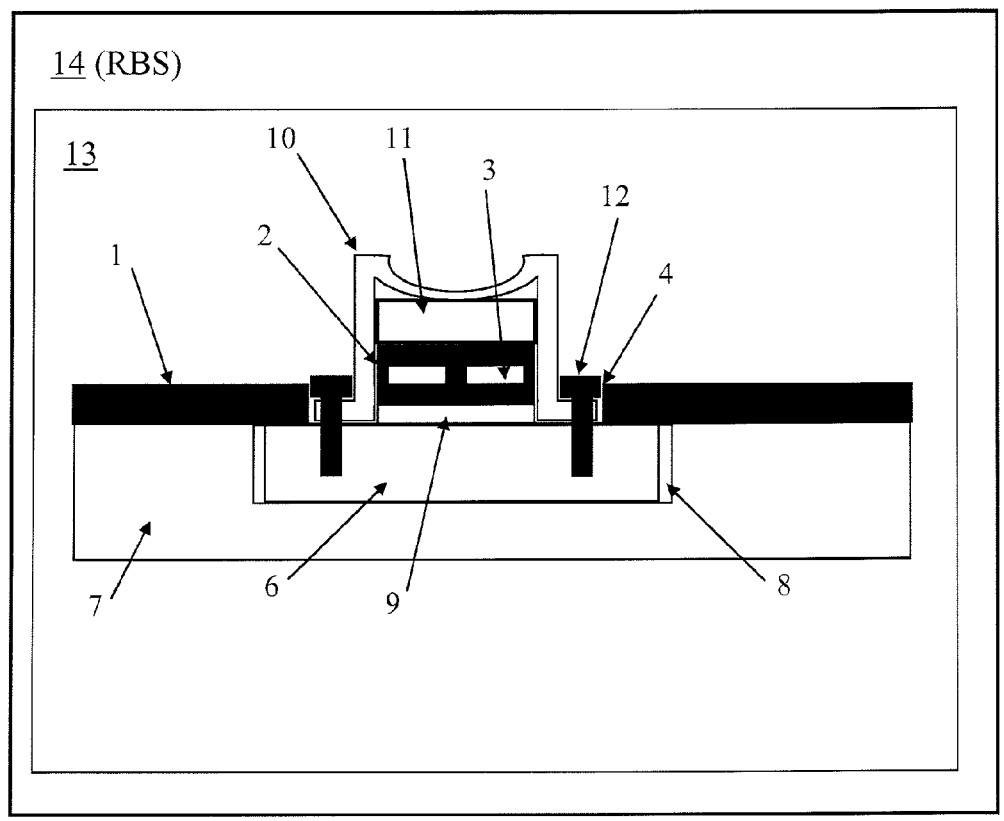
FIG. 5

DEVICE FOR REDUCING THERMAL STRESS ON CONNECTION POINTS

CROSS REFERENCE TO RELATED APPLICATION

This application is a 35 U.S.C. §371 national stage application of PCT International Application No. PCT/SE2007/051016, filed on 17 Dec. 2007, the disclosure and content of which is incorporated by reference herein in its entirety. The above-referenced PCT International Application was published in the English language as International Publication No. WO 2009/078767 A1 on 25 Jun. 2009.

TECHNICAL FIELD

The present invention relates to a device, a radio base station (RBS) and an apparatus for decreasing stress on connection points between heat-generating sources and a substrate. The present invention more particularly relates to reduction of stress induced by thermal expansion.

BACKGROUND

Electronic devices in general and power amplifiers in particular, that are common in many electronic devices such as radio base stations, operate with limited efficiency. Therefore a significant fraction of their power consumption turns into heat. It follows that the thermal design of these devices is important. Such devices are typically air-cooled and their mechanics serve as thermal interface between the hot devices and the air. The heat-generating source, such as a power amplifier transistor or microprocessor, typically attains its thermal contact with the heat-dissipating device by bolting or soldering. The heat-dissipating device can be a cooling flange or heat sink with or without active cooling such as a fan. Heat sinks function by efficiently transferring thermal energy ("heat") from an object at high temperature to a second object at a lower temperature with a much greater heat capacity. This rapid transfer of thermal energy quickly brings the first object into thermal equilibrium with the second, lowering the temperature of the first object, fulfilling the heat sink's role as a cooling device. Efficient function of a heat sink relies on rapid transfer of thermal energy from the first object to the heat sink, which is designed to efficiently dissipate thermal energy to the surrounding air.

Traditionally, the heat-generating device is soldered to a substrate such as a printed circuit board (PCB) as well. In operation, heat generation will cause both the PCB and the cooler to expand. Since they normally are made of different materials, the magnitude of expansion will be determined by their respective coefficients of thermal expansion. A flange, heat sink, is typically made of metal such as aluminum or copper and will therefore expand more than a PCB which is typically made of plastic laminate or other similar materials. A flange might alternatively be made of an alloy. This difference will impart a force on the connection between the PCB and the cooling flange. Ultimately it will also impart a force on the solder joints between the heat-dissipating device and the PCB that it sits on, since transistors and other heat-generating devices are attached to both the PCB and the cooling flange. As the component work load varies during operation, the temperature will cycle causing variation in the mentioned force, which will lead to stress on the connection points.

Experience has shown that this stress will cause the solder joints to fail prematurely, requiring the soldered component or even the complete device to be replaced. This is a costly process, in addition to the interruption of operation. The stress effect is even more pronounced if there is more than one component with significant heat generation in the device.

Patent document U.S. Pat. No. 6,128,190 A describes a transistor clamp provided to obviate solder joints and stress imparted hereon. However not all components are suited for this solution. Due to their design or for other reasons, some components require soldering or similar fixing methods.

SUMMARY

One object of the present invention is to provide a device in which thermal stress on connection points is reduced and thereby service intervals are increased compared to above mentioned prior art.

Another object of the present invention is to provide an apparatus with reduced stress on connection points, which is simple to manufacture without significantly impacting design and production.

Some advantages of the present invention are highly reduced stress level on connection points such as solder joints, increased mean time between failures of an apparatus, higher reliability, less down-time etc. A spin-off effect arising from the present invention is the possibility to use a heat-dissipating device for cooling a variety of heat-generating sources.

An embodiment of the present invention provides a device comprising a larger heat-dissipating part, and at least one smaller heat-dissipating part. The larger part is arranged with at least one cavity for housing the at least one smaller part. The at least one smaller part is adapted to be attached to at least one heat-generating source.

BRIEF DESCRIPTION OF THE DRAWINGS

FIGS. 4a-4d illustrate examples of different shapes of smaller heat-dissipating parts, according to embodiments of the present invention.

FIG. 5 illustrates a side view according to a further embodiment of the present invention.

DETAILED DESCRIPTION

Figure 1:
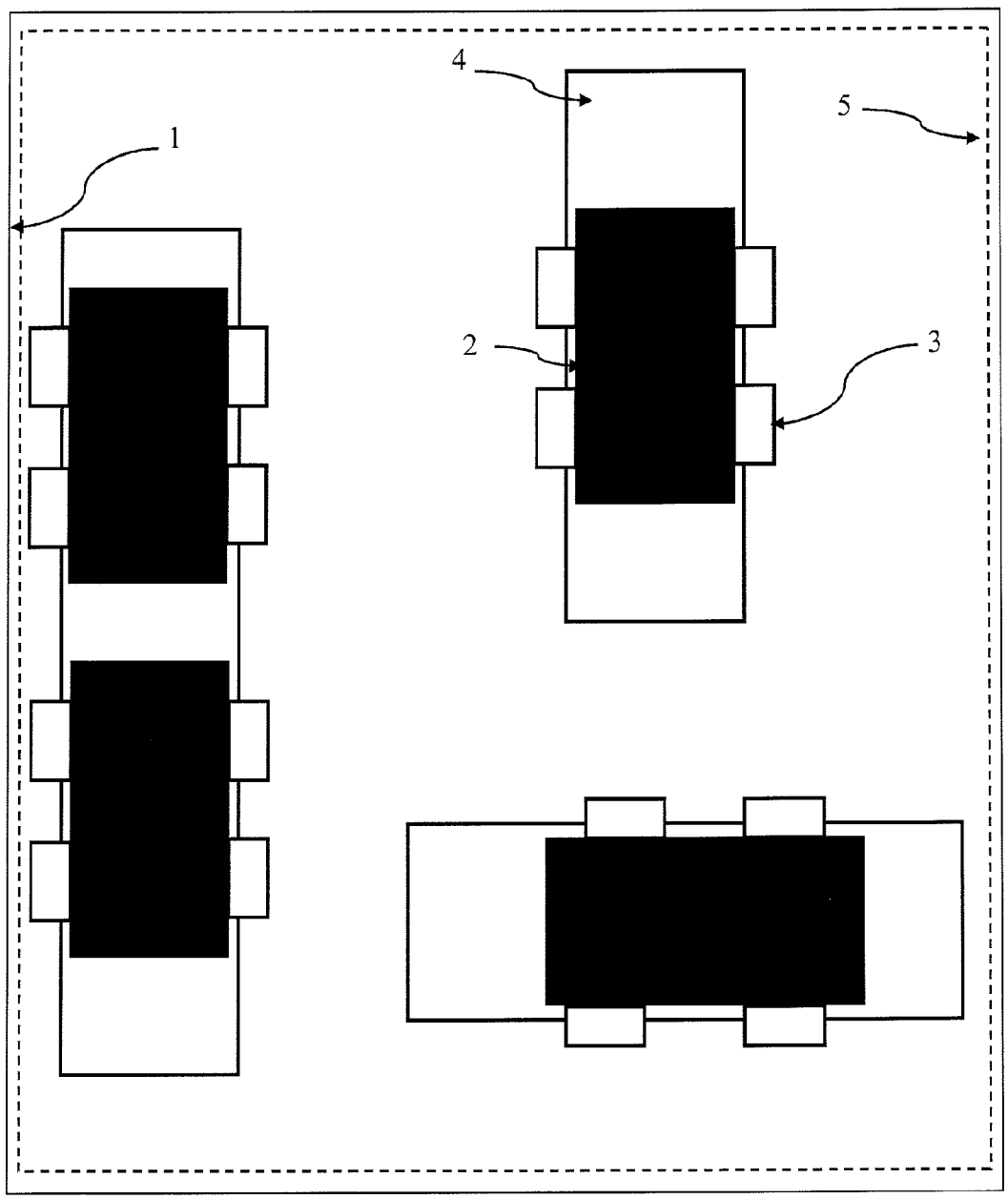
FIG. 1 illustrates a device according to prior art.

FIG. 1 illustrates an example of a prior art Printed Circuit Board 1 (PCB), substrate, comprising cavities 4 and one or more heat-generating sources 2 in the cavities. The heat-generating sources are typically soldered to the substrate by the aid of connecting means 3, which are typically prefixed to the heat-generating sources 2. A heat-dissipating part 5, flange or heat sink, is used to cool the heat-generating sources when active e.g. when for example the transistor is in use. The PCB is typically made of plastic laminate and the heat-dissipating parts, coolers, are made of aluminum or other thermally conductive material. A physical mechanism between failing solder joints is the difference in thermal expansion between plastic laminate and aluminum and the fact that heat-generating sources, like transistors, are affected by both the PCB and the cooler.

Figure 2:
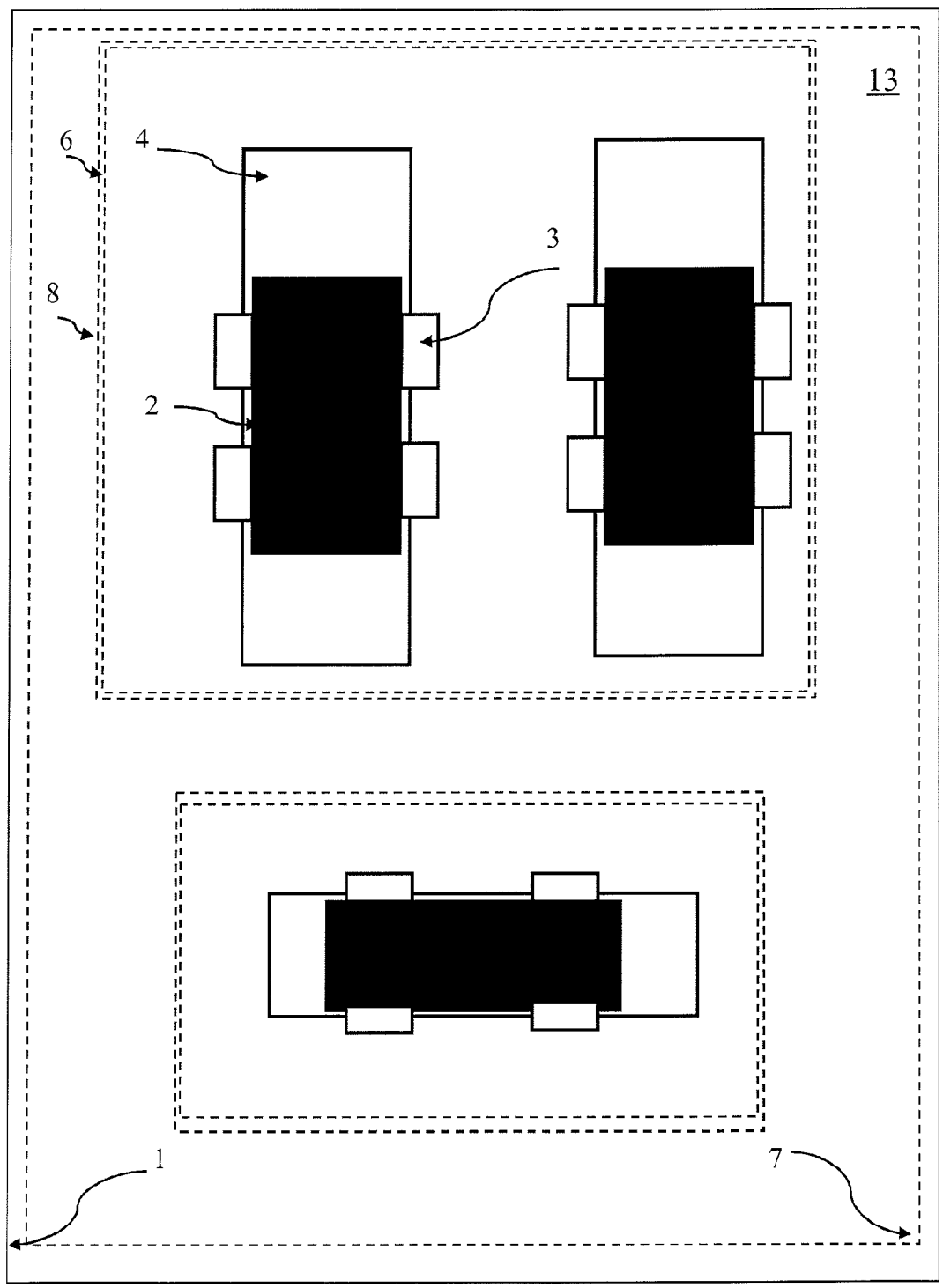
FIG. 2 is a top view illustrating embodiments of the present invention.

FIG. 2 is a top view illustrating a device according to an embodiment of the present invention. The device 13 comprises a larger heat-dissipating part 7 (dashed line), and a smaller heat-dissipating part 6 (dashed line). The larger part 7 is arranged with at least one cavity 8 (dashed line) for housing the smaller part. The smaller part 6 is adapted to be attached to a heat-generating source 2, e.g. a transistor. The present invention is not limited to PCB cavities 4 housing one heat-generating source 2 or to the fact that each small heat-dissipating part 6 is attached to one heat-generating source 2. Different combinations of number of sources 2, per cavity 4, per part 6 exist and are used even though not shown in the figure. Also, the present invention is not limited to one cavity for housing one or more smaller parts 6. Any combination and/or any number of smaller parts 6 are possible. Typically, a PCB 1 comprises several transistors 2, microprocessors and/or any other electrical components in different locations and directions of the PCB. Therefore, there is a need to divide the heat-dissipating device 5 into several smaller parts 6 each interfacing, covering, one or more heat-generating sources 2. By dividing the heat-dissipating device 5 into a smaller part 6 interfacing the heat-generating source 2, the stress in solder joints is experimentally proven to be decreased. Thus, the smaller part is less affected by changes in temperature variations than the larger part 7 due to its size. The heat-dissipating parts together are this way adapted to form an effective heat sink.

Further on if the device 13 comprises at least one cavity 8 that is bigger than the size of the smaller heat-dissipating part 6 that is intended to be housed in that cavity 8, then the smaller part 6 is more mobile in its cavity 8. This decreases the stress even more since there is some mobility relative to the underlying surface. Additionally, it is possible that each cavity 8 can be adapted to house one or more smaller parts 6.

Figure 3A:
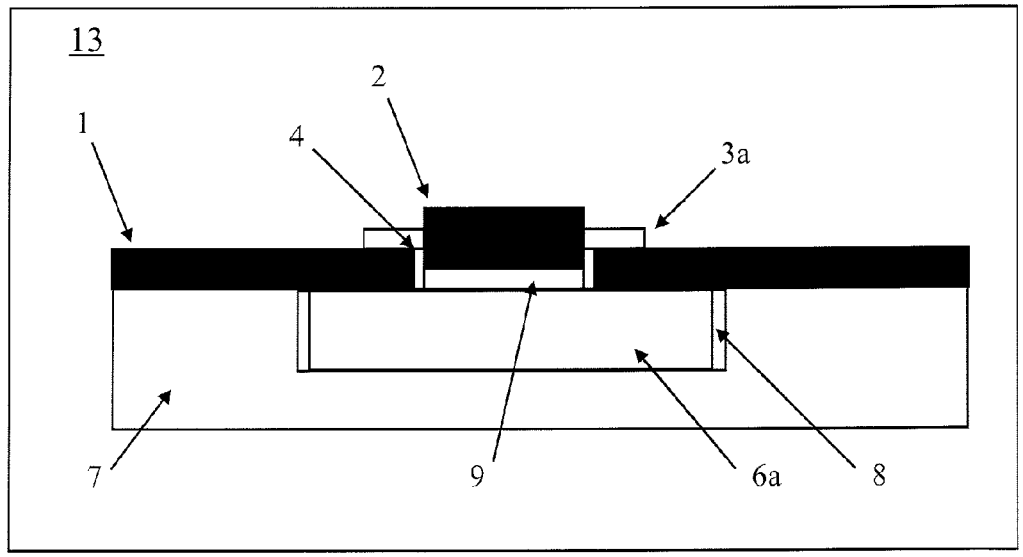
FIGS. 3a and 3b illustrate side views of different embodiments of the present invention.
Figure 3B:
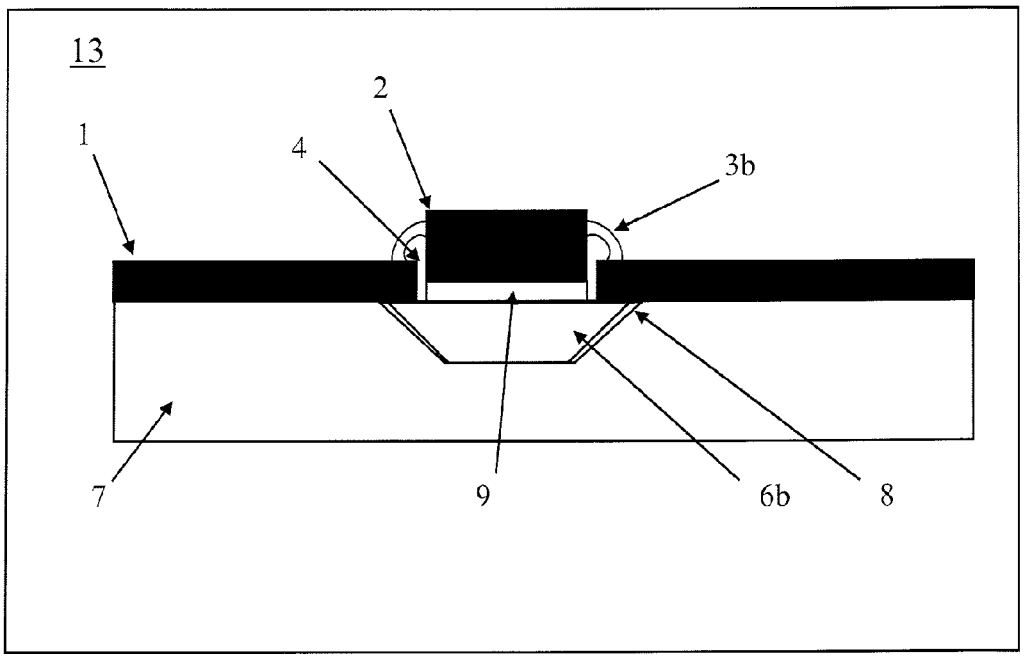

FIGS. 3a and 3b illustrate side views of different embodiments of the present invention. Two different shapes of smaller parts (6a; 6b) are described in FIG. 3a and FIG. 3b. Since the device 13 typically comprises soldered connection points, between the connecting means 3 and the substrate 1, some of the stress on the connection points can be reduced by having lead shaped connecting means 3b (prior art). Using lead shaped connecting means 3b is adapted mainly to reduce stress in one direction, which is sideways looking at the heat-generating source. However some of the stress is reduced in other directions as well based on the flexibility of the lead shaped connecting means 3b. Typically, the heat-generating source is manufactured comprising connecting means (3a; 3b) or the connecting means (3a; 3b) are fixed to the source 2 before delivery to customers.

In another embodiment of the present invention the device 13 further comprises a thermally conductive layer 9, such as aluminum or copper, between the at least one heat-generating source 2 and the at least one smaller heat-dissipating part 6. This layer is needed to compensate for thickness variations between different heat-generating sources, and can also be used as part of a fixing means needed to fix the source 2 to the smaller part 6. In yet another embodiment of the present invention, there is another thermally conductive layer interposed between the smaller 6 and the larger 7 heat-dissipating parts, such as thermal paste (not shown in figure). One purpose of using the other thermally conductive layer is to fill up gaps between the heat source 2 and the smaller part 6.

According to yet another embodiment of the present invention the device 13 comprises at least one smaller part 6 and one larger part 7 wherein at least one smaller part 6 of the device is of the same material as the larger part 7. However this is a non limiting embodiment. For example copper can be used for one or more smaller parts 6 while aluminum is used for the larger part 7. Also other materials or alloys are possible to use, like AlSiC (Aluminum Silicon Carbide) as an example. Thus, it is possible according to the present invention to manufacture heat-dissipating devices with one type of larger part 7 and one or more types of smaller parts 6 depending on the needs and current material cost.

FIGS. 4a-4d illustrate examples of different shapes of smaller heat-dissipating parts, according to embodiments of the present invention. According to these embodiments the device 13 comprises at least one smaller part 6 which is being adapted to the shape of the at least one heat-generating source 2. This is achieved by one or more of the following: a hollowed-out section of the smaller part 6, FIG. 4a and FIG. 4b; a protrusion of the smaller part 6 into the cavity 4, FIG. 4c and FIG. 4d; an extra layer 9, as mentioned above, of similar material as the small part 6 between the smaller part 6 and the heat-generating source 2. FIGS. 4a-4d are non-limiting examples given to explain some of most typical implementations of the present invention. However other shapes of the cavity or the protrusion are possible even though not shown in the figures. Also, the extra layer 9 between the smaller part 6 and the heat-generating source 2 has properties such as shape, thickness and material that can be varied depending on needs and requirements. In some embodiments, the extra layer 9 is not present at all.

FIG. 5 illustrates a block scheme according to another embodiment of the present invention wherein the device 13 further comprises fixing means (9; 10; 11; 12) for attaching the at least one heat-generating source to the at least one smaller part 6 of the device 13. Such fixing means are for example a yoke or a clamp 10 that is bolted or screwed 12 to the smaller part 6 in such a way that pressure is applied to the heat-generating source, assuring reliable contact with the cooling parts (6; 9). A fill-in part 11 is used to separate the heat generating source 2 from the clamp 10 so that the clamp does not effect on the technical functionality of the heat generating source 2. Another purpose with the fill-in part 11 is to fill in gaps caused by that the heat-generating source 2 is of thinner size than calculated and/or designed for. Also, even though soldering is not shown in the figure it is still possible to solder the heat source 2 to the smaller part 6 directly and/or to the substrate if required or requested. In FIG. 5 only a non limiting example is illustrated for describing this embodiment of the present invention in a simple manner. However other shapes and kinds of fixing means (9; 10; 11; 12) are possible to use.

An important benefit achieved by the present invention according to the example mentioned above is that the heat-generating sources are directly bolted or soldered to the smaller heat-dissipating part 6 and are free to move back, forth and sideways in relation to the larger heat-dissipating part 7. The heat source 2 is in this way adapted to follow the substrate, PCB, and "ignore" the larger heat-dissipating part 7 when the larger part 7 and the substrate 1 move relative to each other due to differences in thermal expansion. Pressure is applied on the smaller part 6 by aid of substrate design in such a way that a top surface of the smaller part is typically in same level or higher than a top surface of the larger part 7. The top surface of the larger part 7 is the surface facing the substrate.

It will be understood by those skilled in the art that various modifications and changes may be made to the present invention without departure from the scope thereof, which is defined by the appended claims.

The invention claimed is:
1. A device comprising:
a larger heat-dissipating part; and
at least one smaller heat-dissipating part, wherein the larger part comprises at least one cavity that houses the at least one smaller part, and wherein the at least one smaller part is attached to at least one heat-generating source, wherein the at least one smaller part is adapted to the shape of the at least one heat-generating source by comprising one or more of the following: a hollowed-out section of the smaller part; a protrusion of the at least one smaller part extends into the cavity; an extra layer of similar material as the smaller part is between the at least one smaller part and the heat-generating source.

2. The device of claim 1, further wherein the at least one cavity bigger than the smaller heat-dissipating part which is intended to be housed in that cavity.

3. The device according to claim 1, further comprising fixing means for attaching the at least one heat-generating source to the at least one smaller part of the device.

4. The device according to claim 1, further comprising a thermally conductive layer, which comprises a thermal paste, between the at least one heat-generating source and the at least one smaller heat-dissipating part.

5. The device according to claim 1, wherein the at least one heat-generating source is located in at least one cavity of a substrate, and wherein the substrate is a printed circuit board (PCB).

6. The device according to claim 5, wherein the at least one heat-generating source is soldered to the substrate at one or more connection points by one or more connecting means.

7. The device according to claim 6, wherein the one or more connecting means are lead shaped adapted to decrease stress on the one or more connection points in a certain direction, the stress caused by different thermal expansion in the device.

8. The device according to claim 1, wherein the at least one smaller part of the device is of the same material as the larger part.

9. The device according to claim 1, wherein the at least one smaller part of the heat-dissipating device is of different material than the larger part.

10. The device according to any preceding claim, wherein the at least one heat-generating source comprises a transistor, a microprocessor, and/or another integrated circuit chip.

11. The device according to claim 1, wherein the larger heat-dissipating part and the at least one smaller heat-dissipating part are adapted to form a heat sink.

12. The device according to claim 1, wherein the at least one smaller part is made of different shapes.

13. A radio base station comprising the device of claim 1 connected to receive and dissipate heat from an electronic component that provides an operational function of the radio base station.

14. An apparatus comprising:
a substrate;
at least one heat-generating source;
at least one heat dissipating part that decreases stress, caused by a change of temperature and different coefficients of thermal expansion of the at least one heat-dissipating part and the substrate, on one or more connection points between the at least one heat-generating source and the substrate, wherein each of the at least one heat-generating source is located in a cavity of the substrate, and each of the of the at least one heat-dissipating parts is attached to both the substrate and to the at least one heat-generating source, and wherein each of the at least one heat-dissipating parts comprising a smaller part with an area that interfaces the at least one heat-generating source, and a larger part arranged with a cavity for housing the smaller part, wherein the smaller part is more mobile in the cavity and/or less stress affected by changes in temperature than the larger part,
wherein the at least one smaller part is adapted to the shape of the at least one heat-generating source by comprising one or more of the following: a hollowed-out section of the smaller part; a protrusion of the at least one smaller part extends into the cavity; an extra layer of similar material as the smaller part is between the at least one smaller part and the heat-generating source.

15. The device according to claim 1, wherein the at least one smaller part is adapted to the shape of the at least one heat-generating source by comprising a protrusion that extends into the cavity.

16. The device according to claim 1, wherein the at least one smaller part is adapted to the shape of the at least one heat-generating source by comprising a hollowed-out section that conforms to a shape of the at least one heat-generating source.

17. The device according to claim 1, wherein the at least one smaller part is adapted to the shape of the at least one heat-generating source by comprising an extra layer of similar material as the smaller part between the at least one smaller part and the heat-generating source.

* * * * *

UNITED STATES PATENT AND TRADEMARK OFFICE
CERTIFICATE OF CORRECTION

| | |
|---|---|
| PATENT NO. | : 8,233,281 B2 |
| APPLICATION NO. | : 12/747781 |
| DATED | : July 31, 2012 |
| INVENTOR(S) | : Schöön |

It is certified that error appears in the above-identified patent and that said Letters Patent is hereby corrected as shown below:

In Column 5, Line 12, in Claim 2, after "claim 1," delete "further".

In Column 5, Line 39, in Claim 10, delete "any preceding claim," and insert -- claim 1, --, therefor.

In Column 6, Line 15, in Claim 14, delete "of the of the" and insert -- of the --, therefor.

Signed and Sealed this
Eighteenth Day of December, 2012

David J. Kappos
*Director of the United States Patent and Trademark Office*